United States Patent [19]

Leopold

[11] 4,360,737

[45] Nov. 23, 1982

[54] TOUCH SENSITIVE SWITCH

[75] Inventor: Howard S. Leopold, Plainview, N.Y.

[73] Assignee: Leviton Manufacturing Co., Inc., Little Neck, N.Y.

[21] Appl. No.: 207,172

[22] Filed: Nov. 17, 1980

[51] Int. Cl.³ .............................................. H01H 35/00
[52] U.S. Cl. ........................................ 307/116; 328/5; 200/DIG. 1
[58] Field of Search ................ 307/116, 130; 315/360; 328/5; 200/DIG. 1

[56] References Cited

U.S. PATENT DOCUMENTS 3,940,660  2/1976  Edwards .............................. 315/360
4,031,408  6/1977  Holz ..................................... 307/116

OTHER PUBLICATIONS

*CMOS Cookbook*, Don Lancaster, 1977, p. 280.

Primary Examiner—A. D. Pellinen
Assistant Examiner—James L. Dwyer
Attorney, Agent, or Firm—Paul J. Sutton

[57] ABSTRACT

A switching device for connecting the phase terminal of a load to the phase terminal of an AC supply includes a conductive touch plate in a circuit which is completed upon contact by a person and in which current is caused to flow by virtue of the electric field induced in the body of the person when in proximity to an alternating voltage. A bistable circuit responsive to the induced current flow and switchable between two states is operatively connected to the gate of a triac for rendering the triac conductive during part of each cycle of the alternating voltage or rendering the triac nonconductive depending upon the previous state. Rectifier means are provided for utilizing the AC voltage to power the circuitry and additional means are provided in the form of a zener diode and resistor to prevent the triac from being rendered conductive immediately following an interruption in the alternating voltage.

5 Claims, 1 Drawing Figure

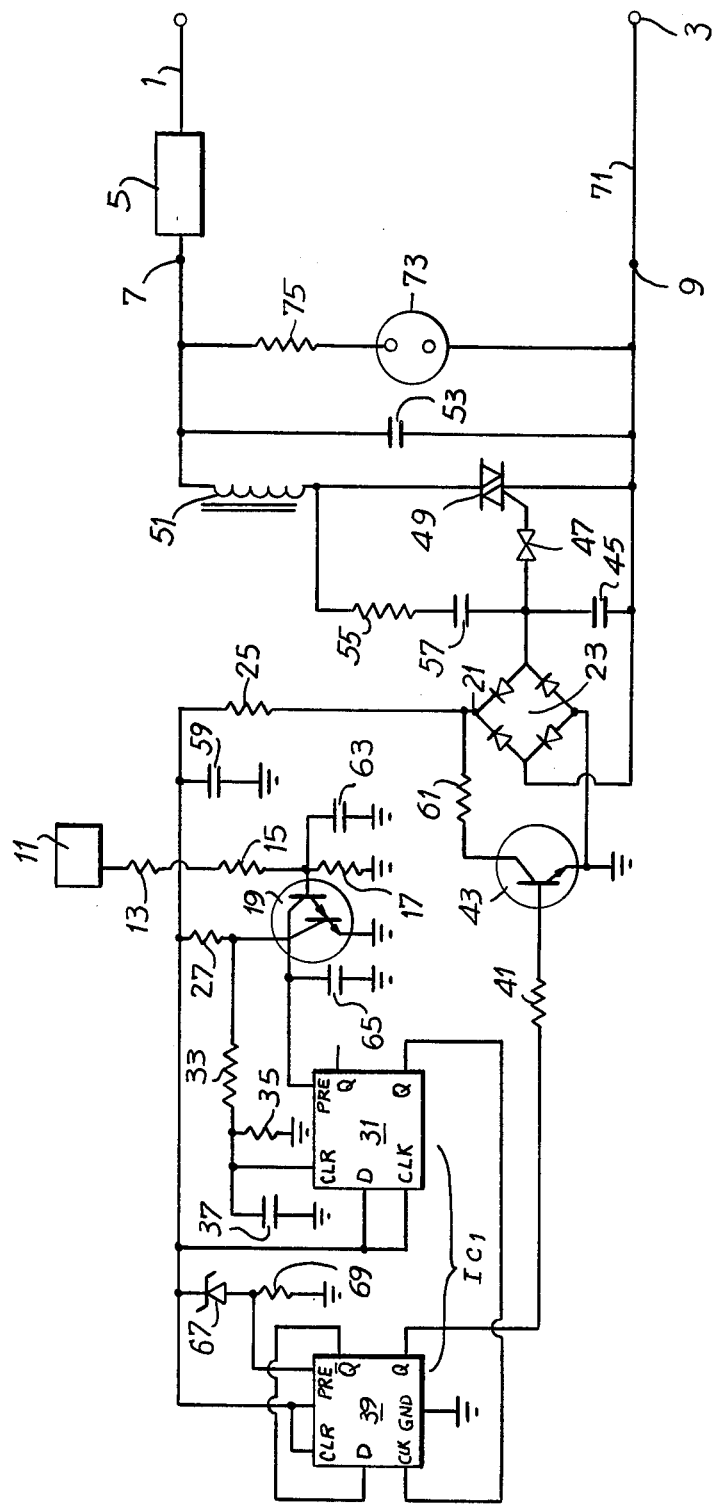

TOUCH SENSITIVE SWITCH

BACKGROUND OF THE INVENTION

This invention deals with touch sensitive switches which are actuable for energizing an AC load in response to the touch of a person without necessity for any moving parts.

Switches are known wherein a touch plate activated device can alternately correct or disconnect a load to or from an alternating current power supply. For such devices to function, it is necessary that they be connected to both the phase and neutral terminals of the AC supply. This requirement makes such switching devices unsuitable for installation in conventional wall switch boxes to which only a line connected to the phase terminal of the power supply is provided, there being no direct neutral connection.

In addition, prior art touch actuated switching devices employ bistable flip-flop circuits which can unpredictably occupy either of their two bistable states following an interruption in the power supplied to them. Such devices often cause appliances to be turned "on" following a power interruption or failure. This can be costly and often is dangerous depending on the nature of the appliances connected to the switching device and the environment in which they are used.

SUMMARY OF THE INVENTION

The present invention overcomes the above stated problems of the prior art in providing a touch sensitive switch which can be connected between a load and the phase terminal of an alternating current power supply to permit application of an alternating voltage to the load without direct connecting of the switching device to the neutral terminal of the alternating power supply. The switching of the invention includes a load terminal connectable to the load to be energized, a phase terminal connectable to the phase line of the alternating power supply, a conductive surface adapted to be touched by a person for actuation of the touch sensitive switch, an electric circuit in which current flow is induced as as result of the capacitive effect of the person touching the touchplate in the presence of the field of an alternating voltage, a bistable circuit having an output occupying one of two states, the output alternately being switched from one state to the other each time current flow is initiated in the circuit, and a switching device connected between the phase and load terminals and having a control gate with a terminal operatively connected to the output of the bistable circuit through a rectifier which energizes the touch actuated circuit and the bistable circuit with a direct voltage derived from the line alternating voltage, an impedance device in a voltage divider circuit for applying an alternating voltage to the control terminal and a switching device responsive to the bistable circuit and connected to a loading circuit for loading the impedance element in the voltage divider when closed in response to one state of the bistable circuit to prevent the control terminal from reaching the voltage necessary to actuate the switching device and disconnecting the loading circuit when open in response to the other state of the bistable circuit for permitting the control gate to reach a threshold voltage necessary to actuate the switching device. Another bistable circuit is connected at the junction of a zener diode and grounded resistor, the zener diode being connected to the positive terminal of the rectifier supply so that the other bistable circuit is held at ground potential following an interruption in the alternating voltage until there is sufficient DC voltage to properly operate the circuitry thereby preventing the switch device from being actuated from a nonconducting to a conducting state as a result of an interruption in the alternating supply voltage.

It is therefore an object of the invention to provide a touch sensitive switch which can connect a load to an alternating current power supply.

Another object of the invention is to provide a touch sensitive switch which can be connected between the load to be connected and the phase terminal of the alternating current supply without direct access to the neutral line of the supply.

Still another object of the invention is to provide a touch sensitive switch which will not be rendered conducting as a result of a voltage interruption in the AC supply.

A further object of the invention is to provide a touch sensitive switch which will alternately connect and disconnect a load from an AC supply in response to each respective sequential touching of a touch plate.

Other and further objects of the invention will be apparent from the following drawing and description of a preferred embodiment of the invention in which like reference numerals are used to indicate like parts.

DESCRIPTION OF THE DRAWING

FIG. 1 is an electrical schematic diagram of the apparatus of the preferred embodiment of the invention.

DESCRIPTION OF THE PREFERRED EMBODIMENT

Referring now to the drawing, there is shown an alternating voltage and current source having a neutral line 1 and a phase line 3. A load 5 which can be a household appliance, for example, is connected at one end to the neutral line 1 and at the other end to a load terminal 7 of the touch sensitive switch of the invention. A phase terminal 9 of the touch sensitive switch is connected to the phase line 3 of the alternating voltage source.

A touch plate 11 having a conductive surface is connected to ground through series resistors 13, 15 and 17. The junction between resistors 15 and 17 is connected to the base of a transistor comprising the first stage of a Darlington amplifier 19.

A person standing within reach of the touchplate 11 is within the electric field generated by the alternating voltage source and has impressed across his body a voltage due to the capacitive effect of the body. When the person touches the touchplate 11 the voltage is applied between the touchplate 11 and ground causing a very small current to flow through resistors 13, 15 and 17 to ground. Resistors 13 and 15 are each, in the preferred embodiment of the invention, 4.7 megohms and hence the current is extremely small, on the order of less than 25 microamperes. Resistor 17, in the preferred embodiment, is 470 kiloohms. Positive current flow from the touch plate 11 to ground causes a voltage drop across resistor 17 which raises the potential of the base of the Darlington amplifier 19 above ground sufficiently to render the Darlington amplifier 19 conducting. This results in a flow of direct current from the positive output 21 of a bridge rectifier 23 through a resistor 25 having a value of 10,000 ohms, through a resistor 27 having a value of 470 kilo-ohms connected directly to the output of the Darlington amplifier 19 at the collector of its output transistor and from the reset input of a bistable multivibrator 31. The application of a positive voltage to the reset input of the multivibrator 31 causes the Q output of the multivibrator 31 to go to a high state. The positive voltage from the resistor 27 is also applied to the clear input of the multivibrator 31 through an RC delay network including resistors 33 and 35 which have values of 1 megohm and 10 megohms respectively in the preferred embodiment of the invention, and a capacitor 37 which in the preferred embodiment has a value of 0.0033 microfarads. Application of the positive signal to the clear input of the multivibrator 31 through the delay network causes the Q output of the multivibrator 31 to go low. Hence the Q output of the multivibrator is a high-going or positive pulse having a width dependent on the time constant of the delay network including resistors 33 and 35 and capacitor 37.

The Q output of the bistable multivibrator 31 is directly connected to the clock input of a bistable multivibrator 39. The $\overline{Q}$ output of the multivibrator 39 is directly connected to its D input so that each time a positive pulse appears at the clock input the Q and $\overline{Q}$ outputs reverse states. Since the Q and $\overline{Q}$ states are always opposites or inverses of one another, that is when Q is high $\overline{Q}$ is low and when Q is low $\overline{Q}$ is high, each time a positive pulse appears at the clock input of the multivibrator 39 the Q output changes to a low state if it was previously in a high state and changes to a high state if it was previously in a low state. The Q output of the multivibrator 39 is connected through a resistor 41 having a value of 56 kilo-ohms to the base of a transistor 43 which is connected in parallel with the output of the bridge rectifier 23.

Upon appearance of a positive signal at the Q output of the bistable multivibrator 39, that is when the Q output is in a high state, the transistor 43 is rendered conducting thereby placing a load on the rectifier 23 so that current is drawn from a 0.047 microfarad capacitor 45 which is connected between the phase terminal 9 of the touch sensitive switch and a diac 47 which is in turn connected to the control gate of a triac 49. When the transistor 43 is nonconducting the voltage on capacitor 45 is sufficient to overcome the breakdown threshold of the diac 47 and actuate the triac 49 to render it conducting. When the transistor 43 conducts, the load it presents to the capacitor 45 through the rectifier 23 prevents the voltage across the capacitor 45 from reaching the breakdown level of the diac 47 so that the triac 49 does not conduct.

The triac 49 is connected in series with an inductor 51 and the triac 49 and inductor 51 are in parallel with a capacitor 53. The inductor 51 and capacitor 53 provide high frequency transient suppression. The inductor 51 is sized according to the size of the load 5 whereas the capacitor 53, in the preferred embodiment of the invention, has a value of 0.047 microfarad.

A resistor 55 and a capacitor 57 are connected between the suppression inductor 51 and the diac 47 to insure that the triac 49 is rendered nonconducting during at least a portion of the cycle of the alternating voltage so that there is sufficient output voltage from the bridge rectifier 23 to power the DC circuitry in the touch sensitive switch. In the preferred embodiment of the invention, resistor 55 has a value of 3.3 kilo ohms and capacitor 57 has a value of 0.22 microfarads.

The AC voltage across the capacitor 45 is applied to the input of the bridge rectifier 23 to provide the DC voltage that drives the switch circuitry. This DC voltage is filtered by a 3.3 microfarad capacitor 59 and regulated by resistor 25, diac 47, resistor 55, capacitor 57 and a 1.8 kilo-ohm resistor 61 connected between the positive output of the bridge rectifier 23 and the collector of transistor 43 so that the DC voltage stays within a range of approximately 6 to 14 volts irrespective of whether the load 5 is turned on or off or the voltage on the AC line is at a high or low portion of its cycle.

Capacitor 63 and 65, having values of 0.033 microfarads and 0.22 microfarads respectively, filter transients at the input and output of the Darlington amplifier 19 respectively.

In order to insure that an interruption in the power supplied on the AC line does not cause the load 5 to be energized without actuation by touching the touchplate 11, circuitry is provided to insure that the Q output of the bistable multivibrator 39 is high following any power interruption. A zener diode 67 is connected between the positive output of the rectifier 23, downstream of resistor 25, and a 68 kilo-ohm resistor 69 which is connected to ground. The juncture of the resistor 69 and zener diode 67 is connected to the reset input of the bistable multivibrator 39. As a consequence of this arrangement, the reset input of the multivibrator 39 is held at ground potential following a power interruption until the voltage downstream of resistor 25 builds up sufficiently to a level to exceed the breakdown voltage of the zener diode 67 at which time the multivibrator 39 will not change states except when caused to do so by a touch of the touchplate 11.

The operation of the touch sensitive switch will now be explained beginning under assumption of a condition where the alternating line voltage between the neutral line 1 and phase line 3 is active and the load 5 is turned off, that is, the triac 49 is in a nonconducting state. Under these conditions, the Q output of the multivibrator 39 is high and the transistor 43 is conducting so that the voltage across capacitor 45 is below the threshold necessary to overcome the breakdown voltage of the diac 47 to actuate the triac 49. If a person wishing to turn the load 5 "on" touches the touchplate 11, a current flows through resistor 17 thereby rendering the Darlington amplifier 19 conductive so that a positive voltage is applied to the reset input of the bistable multivibrator 31 making its Q output go high and, shortly thereafter, a positive voltage is applied to the clock input of the multivibrator 31 again rendering the Q output low. The resultant positive pulse at the Q output of multivibrator 31 is applied to the clock input of multivibrator 39 thereby changing its Q output from high to low. The low signal at the Q output of multivibrator 39 causes transistor 43 to stop conducting thereby removing the load including resistor 61 from the output of the bridge rectifier 23. This results in a rise in the AC voltage across capacitor 45 sufficient to overcome the breakdown threshold of the diac 47 and to render the triac 49 conducting. The load 5 is now connected between the neutral line 1 and phase line 3 of the alternating voltage supply through inductor 51 and triac 49.

If the touchplate 11 is touched a second time, the Darlington amplifier 19 is again momentarily rendered conductive, a positive pulse is produced at the Q output of multivibrator 31 as heretofore explained, and the Q output of multivibrator 39 goes from low to high. The high Q output causes transistor 43 to conduct thereby loading capacitor C5 through the rectifier 23 and limiting the voltage across the capacitor 45 to below the threshold necessary to overcome the breakdown voltage of the diac 47. Triac 49 then ceases conducting and the load 5 is turned off.

In order to insure that the load 5 can be completely isolated from the phase line of the alternating voltage supplied in the event of a circuit failure in the touch sensitive switch circuitry, a mechanical air gap switch 71 can be connected between the phase terminal 9 and the triac 49. The air gap switch 71 is preferably a push-push switch having a movable actuator which successively changes the state of the air gap switch 71 from open to closed or from closed to open depending on its previous state each time the push button is actuated. Such mechanical switches are commercially available and will be known to those skilled in the art. For convenience, the push button actuator of the mechanical air gap switch can be mounted behind the touch plate 11 and the touch plate 11 can be movably mounted so that pressure on the touchplate beyond a predetermined mount will actually move the touchplate against the push button thereby actuating the mechanical switch 71. Hence, if the touchplate is touched to turn the load 5 on or off and the touch sensitive switch fails to properly operate, additional pressure can be applied to the touchplate to actuate the mechanical actuator of the air gap switch 71 which can be opened to disconnect the load 5 from the source of alternating voltage or closed to reconnect the load 5 after the switch 71 has previously been opened.

An indicator light 73 in series with a limiting resistor 75 can be connected between the load terminal of the touch sensitive switch and the terminal of the air gap switch 71 which is opposite the phase terminal 9 of the touch sensitive switch. When the indicator light 73 is lit, it will indicate that the air gap switch 71 is closed and when unlit it will indicate that the air gap switch 71 is open.

What is claimed is:

1. A touch sensitive switch for selectively connecting a load to the phase line of a source of alternating voltage comprising:

a load terminal adapted to be connected to said load, a phase terminal adapted to be connected to the phase line of said voltage source, a conductive surface, a first electrical circuit connected between said conductive surface and ground, a first switching device having a control terminal operatively connected to said first circuit and responsive to the voltage therein, time delay means connected to said first switching device, a first bistable circuit with an output occupying one of first and second states, said bistable circuit switching from said one state to the other of said states in response to current flow in said first switching device, a second bistable circuit connected between said first circuit and first bistable circuit, said second bistable circuit having two inputs, the first of said inputs being directly connected to said first switching device and the second of said inputs being connected to said time delay means for receiving a signal conducted by said first switching device after said signal is received at said first input, said second bistable circuit applying to said first bistable circuit a signal pulse of predetermined width in response to current flow in said first circuit, said first bistable circuit switching from said one state to said other state in response to application of said pulse, a second switching device adapted to be connected between said phase terminal and load terminal and having a control terminal, said second switching device being normally rendered nonconducting until an actuating voltage exceeding a threshold magnitude is applied to said control terminal, and voltage applicator means responsive to said first bistable circuit for applying said actuating voltage to said control terminal of said second switching device only when said first bistable circuit is switched to said second state.

2. Apparatus according to claim 1, wherein said voltage applicator means includes:

a circuit element having an impedance and operatively connected between said control terminal of said second switching device and said phase terminal, a switch means connected to said circuit impedance element, and a loading circuit connected to said switch means, said switch means being responsive to said first bistable circuit for conducting current between said voltage applicator means and said loading circuit when said bistable circuit is in said first state thereby preventing voltage applied to said control terminal from exceeding said threshold magnitude and preventing said current flow when first bistable circuit is in said second state thereby permitting said voltage applicator means to apply to said control terminal a voltage exceeding said threshold magnitude.

3. Apparatus according to claim 2, further comprising rectifier means having an AC input connected between said phase and load terminals and a DC output connected between ground and said delay circuit, and means for preventing said actuating voltage from exceeding said threshold voltage at least part of each cycle of said alternating voltage irrespective of the state of said first bistable circuit whereby a DC voltage is always present at said rectifier output when said alternating voltage is applied at said phase and load.

4. Apparatus according to claims 1, 2, or 3, further comprising holding means operatively connected to said first bistable circuit and to said rectifier means for maintaining said first bistable circuit in said first state when said rectifier DC output voltage is below a predetermined magnitude.

5. Apparatus according to claim 4, wherein said holding means includes a zener diode having one terminal connected to the positive terminal of said rectifier, a resistor connected between the other terminal of said zener diode and ground, and an input of said first bistable circuit connected to said other terminal of said zener diode, said input terminal maintaining said first bistable circuit in said first state when held at ground potential.

* * * * *